United States Patent
Li et al.

(10) Patent No.: US 9,455,727 B2
(45) Date of Patent: Sep. 27, 2016

(54) OPEN-LOOP VOLTAGE REGULATION AND DRIFT COMPENSATION FOR DIGITALLY CONTROLLED OSCILLATOR (DCO)

(71) Applicant: INTEL CORPORATION, Santa Clara, CA (US)

(72) Inventors: Shenggao Li, Pleasanton, CA (US); Guluke Tong, San Ramon, CA (US); Sujatha B. Gowder, Cupertino, CA (US); Fulvio Spagna, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/498,728

(22) Filed: Sep. 26, 2014

(65) Prior Publication Data

US 2016/0094231 A1    Mar. 31, 2016

(51) Int. Cl.
| | |
|---|---|
| *H03L 1/00* | (2006.01) |
| *H03L 7/099* | (2006.01) |
| *H03L 1/02* | (2006.01) |
| *H03L 7/093* | (2006.01) |
| *H03L 7/24* | (2006.01) |

(52) U.S. Cl.
CPC ............. *H03L 7/0991* (2013.01); *H03L 1/022* (2013.01); *H03L 7/093* (2013.01); *H03L 7/24* (2013.01)

(58) Field of Classification Search
CPC ......... H03L 1/022; H03L 7/24; H03L 7/093; H03L 7/0991
USPC .................... 331/186, 57, 16, 34, 177 R, 183
See application file for complete search history.

(56) References Cited

U.S. PATENT DOCUMENTS

| | | | |
|---|---|---|---|
| 7,688,150 B2 * | 3/2010 | Kurd et al. ...................... 331/44 |
| 8,513,995 B2 | 8/2013 | Wang | |
| 2009/0309666 A1 | 12/2009 | Sun et al. | |
| 2013/0076450 A1 * | 3/2013 | Rao et al. ........................ 331/34 |
| 2013/0249611 A1 | 9/2013 | Vandepas | |
| 2013/0278347 A1 | 10/2013 | Li | |
| 2013/0307631 A1 * | 11/2013 | Lotfy et al. ..................... 331/34 |
| 2014/0035691 A1 | 2/2014 | Lamanna et al. | |

FOREIGN PATENT DOCUMENTS

KR         20090063629 A      6/2009

OTHER PUBLICATIONS

International Search Report and Written Opinion mailed Mar. 18, 2016 for International Application No. PCT/US2015/045735, 9 pages.

* cited by examiner

*Primary Examiner* — Arnold Kinkead
(74) *Attorney, Agent, or Firm* — Schwabe, Williamson & Wyatt, P.C.

(57) ABSTRACT

Embodiments include apparatuses, methods, and systems for open-loop voltage regulation and drift compensation for a digitally controlled oscillator (DCO). in embodiments, a communication circuit may include a DCO, an open-loop voltage regulator, and a calibration circuit. The open-loop voltage regulator may receive a calibration voltage and may generate a regulated voltage. The regulated voltage may be passed to the DCO. During a calibration mode, the calibration circuit may compare the regulated voltage to a reference voltage and adjust the calibration voltage based on the comparison to provide the regulated voltage with a target value. During a monitoring mode, the calibration circuit may receive a tuning code that is used to tune the DCO and further adjust the calibration voltage based on a value of the tuning code.

18 Claims, 4 Drawing Sheets

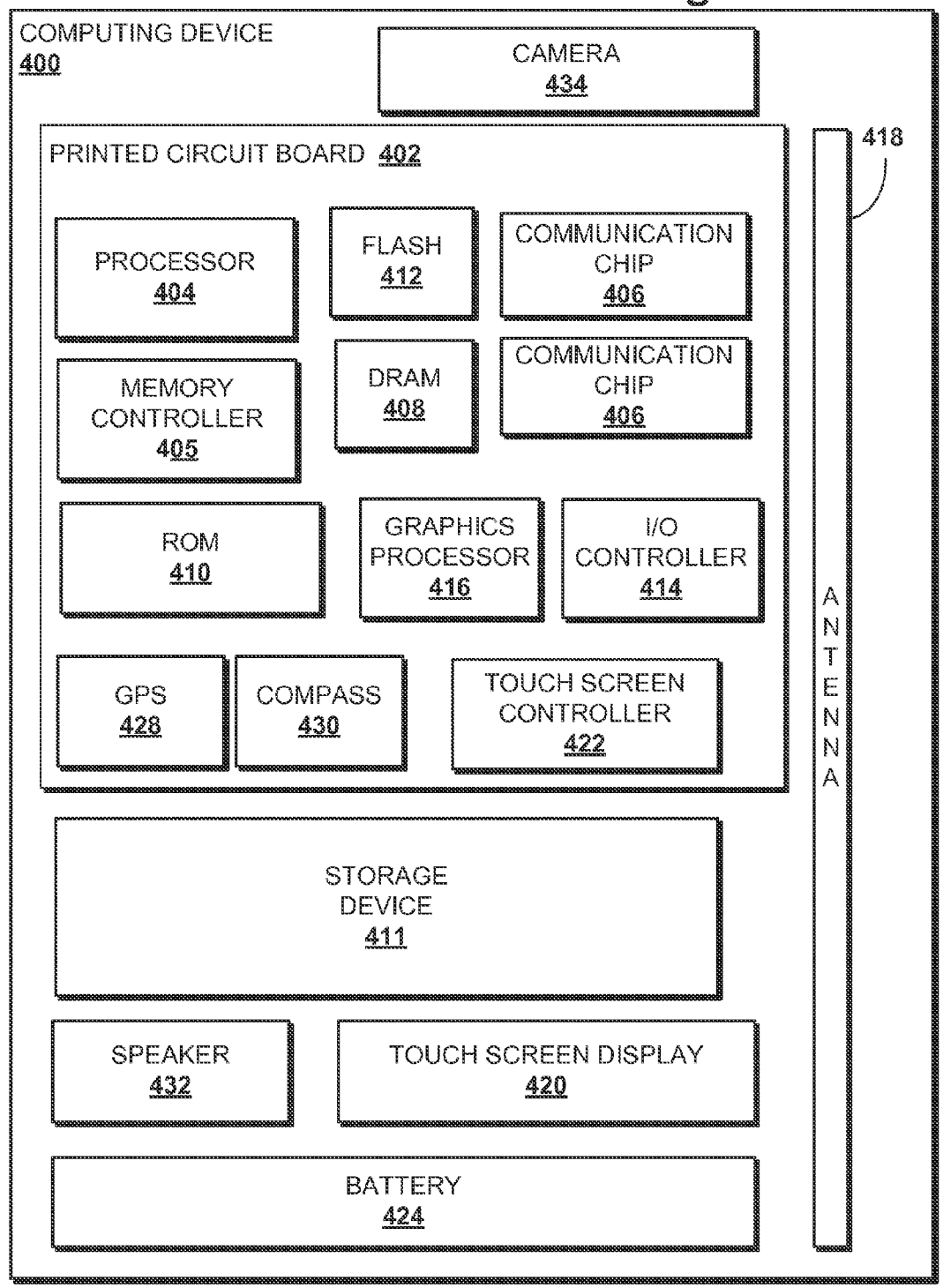

OPEN-LOOP VOLTAGE REGULATION AND DRIFT COMPENSATION FOR DIGITALLY CONTROLLED OSCILLATOR (DCO)

FIELD

Embodiments of the present invention relate generally to the technical field of electronic circuits, and more particularly to open-loop voltage regulation and drift compensation for digitally controlled oscillators (DCOs).

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Many digitally controlled oscillators (DCOs) include a ring oscillator. However, the ring oscillator typically includes high sensitivity to supply noise (e.g., the frequency of the oscillator varies significantly with a change in supply voltage) and high intrinsic jitter.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 4 illustrates an example system configured to employ the apparatuses and methods described herein, in accordance with various embodiments.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described. embodiment. Various additional operations may be performed and/or described operations may be omitted in additional embodiments.

For the purposes of the present disclosure, the phrases "A and/or B" and "A or B" mean (A), (B), or (A and B), For the purposes of the present disclosure, the phrase "A, B, and/or C" means (A), (B), (C), (A and B), (A and C), (B and C), or (A., B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Figure 1:
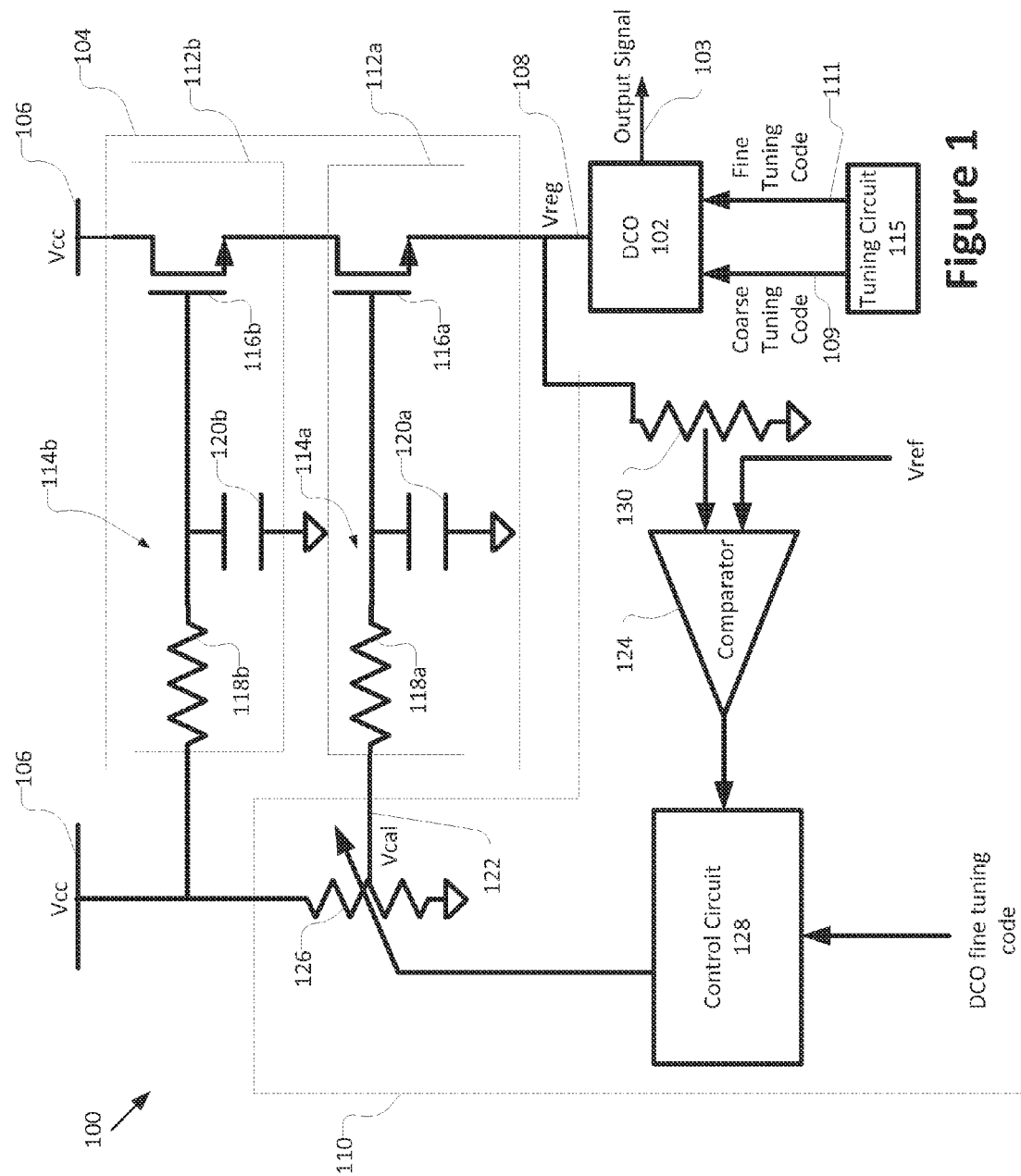
FIG. 1 schematically illustrates a circuit including a digitally controlled oscillator (DCO), an open-loop voltage regulator, and a calibration circuit in accordance with various embodiments.

FIG. 1 schematically illustrates a circuit 100 in accordance with various embodiments. The circuit 100 may include a digitally controlled oscillator (DCO) 102 to generate an output signal at an output terminal 103. The circuit 100 may further include an open-loop voltage regulator 104 coupled to the DCO 102, The open-loop voltage regulator 104 may be coupled to a supply rail 106 to receive a supply voltage (Vcc). The open-loop voltage regulator 104 may be further coupled to a power input terminal 108 of the DCO 102 to provide a regulated voltage, Vreg, to the DCO 102. The regulated voltage, Vreg, may be used by the DCO 102 as a supply voltage.

In various embodiments, the DCO 102 may receive a coarse tuning code at a coarse tuning input 109 of the DCO 102 and may receive a fine tuning code at a fine tuning input 111 of the DCO 102. The coarse tuning code and fine tuning code may be digital codes (e.g., including a plurality of bits). The frequency of the output signal generated by the DCO 102 may be adjusted by adjusting the coarse tuning code and/or the fine tuning code. The coarse tuning code may be used to make larger adjustments in the frequency of the output signal than the fine tuning code. In some embodiments, the coarse tuning code and the fine tuning code may be provided by a tuning circuit 115. The tuning circuit 115 may adjust the coarse tuning code and/or fine tuning code so that the output frequency has a desired frequency (e.g., using a feedback loop). In some embodiments, the tuning circuit 115 may adjust the coarse tuning code and/or fine tuning code using a proportional, integral, derivative controller (e.g., using proportional, integral, and derivative values).

In various embodiments, the circuit 100 may further include a calibration circuit 110 coupled to the open-loop voltage regulator 104. During a calibration mode of the circuit 100, the calibration circuit 110 may adjust the value of a calibration voltage, Vcal, received by the open-loop voltage regulator 104. In various embodiments, the calibration voltage, Vcal, may be adjusted to provide the regulated voltage, Vreg, with a target value (e.g., a pre-defined target value). After calibration, the circuit 100 and/or DCO 102 may enter a normal operating mode. Accordingly, the calibration of the calibration voltage, Vcal, may compensate for process variation and/or other factors in the open-loop voltage regulator 104.

In some embodiments, during the normal operating mode, the calibration circuit 110 may further adjust the calibration voltage, Vcal, to compensate for drift in one or more tuning codes used to tune the DCO 102 to generate the output signal with the desired frequency. For example, the calibration circuit 110 may receive a tuning code (e.g., the fine tuning code) that is used to adjust the frequency of the output signal generated by the DCO 102, and the calibration circuit 110 may adjust the calibration voltage Vcal on that the tuning code remains within a pre-determined range of code values, Monitoring and compensating for the drift in the tuning code may allow a DCO with a lower tuning range (e.g., a lower number of bits for the tuning code) to be used than in circuits that do not monitor and compensate for the drift in the tuning code.

Figure 2:
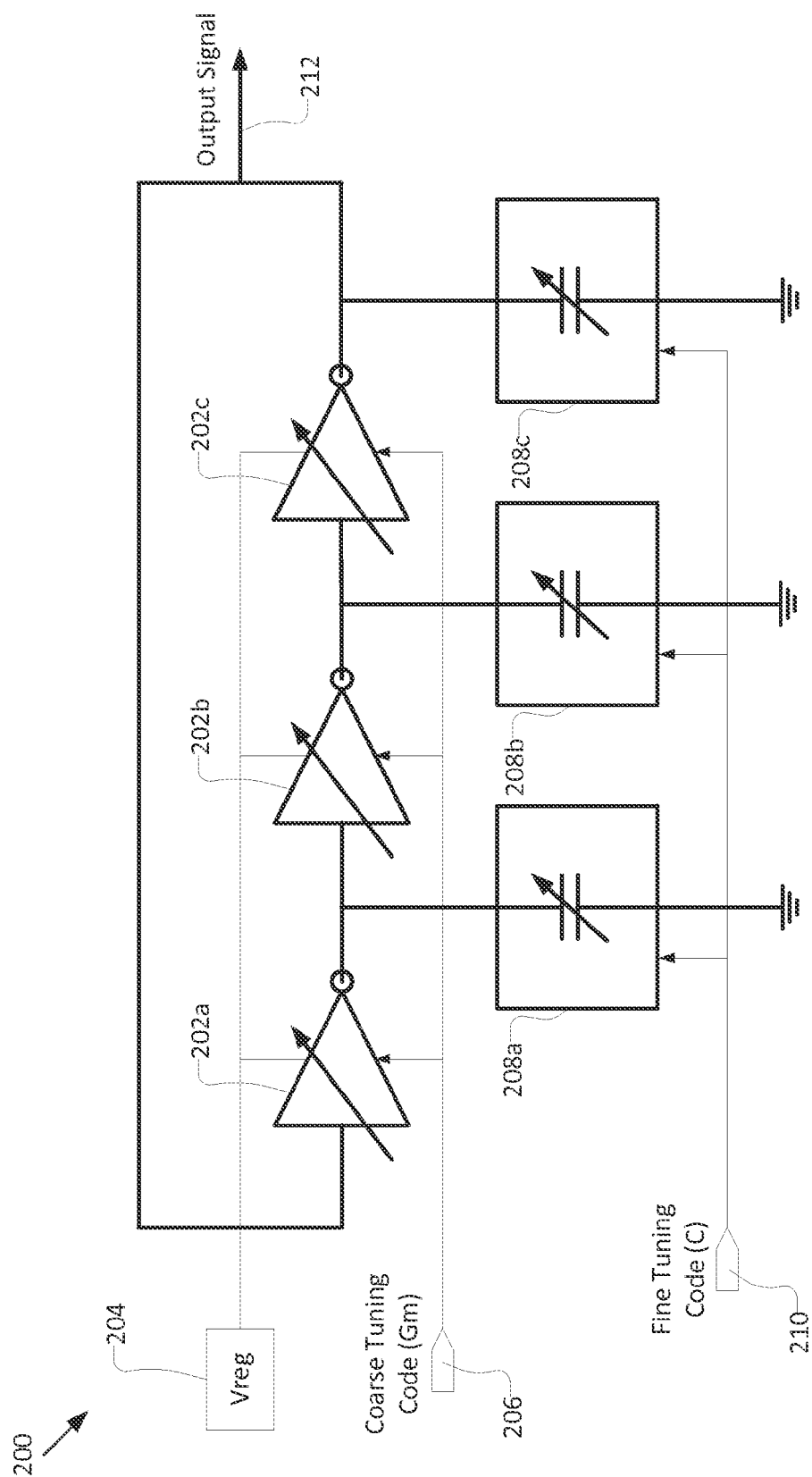
FIG. 2 illustrates an example DCO in accordance with various embodiments.

FIG. 2 illustrates an example DCO 200 that may be included in the DCO 102 of FIG. 1 in some embodiments. The DCO 200 may include a plurality of inverters 202*a-c* coupled in series with one another (e.g., with the output of inverter 202*a* coupled to the input of inverter 202*b*, etc.). The inverters 202*a-c* may form a feedback loop, with the output of inverter 202*c* being coupled to the input of inverter 202*a*. The inverters 202*a-c* may be coupled to a power input terminal 204 to receive a regulated supply voltage (e.g., the regulated voltage, Vreg, of FIG. 1). The inverters 202*a-c* may be further coupled to a coarse tuning input 206 to receive a coarse tuning code. The coarse tuning code may be used to adjust the gain of the inverters 202*a-c*. In various embodiments, the DCO 200 may further include a plurality of capacitor banks 208*a-c* coupled between respective nodes between pairs of the inverters 202*a-c*. The capacitor banks 208*a-c* may be coupled to a fine tuning input 210 to receive a fine tuning code. The fine tuning code may be used to adjust the capacitance provided by the capacitor banks 208*a-c*. Other embodiments may include another type of DCO and/or use other tuning mechanisms to tune the frequency of the DCO.

In various embodiments, the DCO 200 may generate an output signal at an output terminal 212. A frequency of the output signal may be tuned by adjusting the coarse tuning code and/or the fine tuning code. However, the DCO 200 may have a high sensitivity to variation in the regulated voltage Vreg. Additionally, the frequency of the output signal generated by the DCO 200 may vary across process, voltage, and/or temperature (PVT) conditions. In various embodiments, the open-loop voltage regulator 104 of the circuit 100 may provide the regulated voltage Vreg with low-noise. Additionally, the calibration circuit 110 of circuit 100 may adjust the value of the regulated voltage Vreg to compensate for PVT variation in the voltage regulator 104 and/or DCO 200.

Referring again to FIG. 1, the open-loop voltage regulator 104 may include one or more regulator stages 112*a-b*. The individual regulator stages 112*a-b* may include a low-pass filter 114*a-b* coupled to a transistor 116*a-b*. The filter 114*a-b* may be coupled to a gate terminal of the respective transistor 116*a-b*. Accordingly, the filter 114*a-b* may filter the voltage that is passed to the gate terminal of the respective transistor 116*a-b*.

In some embodiments, the low-pass filters 114*a-b* may be resistance-capacitance (RC) filters including one or more resistors 118*a-b* and one or more capacitors 120*a-b*.

Although the filters 114*a-b* are shown in FIG. 1 to be first-order filters including a single resistor 118*a-b* and a single capacitor 120*a-b*, other embodiments may be second- or higher-order filters including a plurality of resistors and/or capacitors. The resistors 118*a* may be coupled between a gate terminal of the transistor 116*a* and node 122 that receives the calibration voltage Vcal. The capacitor 120*a* may be coupled in shunt with the gate terminal of the transistor 116. The filters 4*a-b* may filter out high-frequency noise in the calibration voltage Vcal to provide the regulated voltage Vreg with low noise.

The open-loop voltage regulator 104 may not filter out low frequency noise. However, any low-frequency noise may be suppressed by a phase-locked loop (PLL) and/or clock-and-data recovery circuit (CDR).

In embodiments in which the open-loop voltage regulator 104 includes multiple regulator stages 112*a-b*, the regulator stages 112*a-b* may be cascaded, with the transistors 116*a-b* coupled in series between the supply rail 106 and the power input terminal 108 of the DCO 102. other embodiments, the open-loop voltage regulator may include only a single regulator stage (e.g., may include regulator stage 112*a* but not regulator stage 1124 For example, the open-loop voltage regulator 104 may include a plurality of regulator stages 112*a-b* in embodiments in which the supply voltage Vcc is higher. one non-limiting example, a single regulator stage 112*a* may be used when the supply voltage Vcc is about 1.24-1.35 Volts, and two regulator stages 112*a-b* may be used when the supply voltage Vcc is about 1.8 Volts or higher. In yet other embodiments, the open-loop voltage regulator 104 may include more than two regulator stages 112*a-b*.

In various embodiments, the open-loop voltage regulator 104 may generate the regulated voltage Vreg with low-noise. Additionally, the open-loop voltage regulator 104 may consume only a small amount (e.g., negligible amount) of current. However, the open-loop voltage regulator 104 may be susceptible to variation across PVT conditions. Accordingly, the calibration circuit 110 may be included in the circuit 100 to compensate for variation in PVT conditions, as described herein.

In various embodiments, the calibration circuit 110 may include a comparator 124, a potentiometer 126 (e.g., a digital potentiometer), and/or a control circuit 128. In various embodiments, the potentiometer 126 may be coupled to the open-loop voltage regulator 104 (e.g., with the variable impedance terminal of the potentiometer 126 coupled to the input of the low-pass filter 114*a* of the regulator stage 112*a*). Accordingly, the calibration circuit 110 may adjust the impedance of the potentiometer 126 to adjust the value of the calibration voltage, Vcal.

In various embodiments, a first input of the comparator 124 may be coupled to the power input terminal 108 to receive the regulated voltage Vreg. A second input of the comparator 124 may receive a reference voltage Vref. The reference voltage Vref may correspond to the target value of the regulated voltage Vreg. In some embodiments, the first input of the comparator 124 may receive the regulated voltage Vreg via a voltage divider 130. The voltage divider 130 may scale the regulated voltage Vreg so that the scaled value of the regulated voltage is approximately equal to the reference voltage Vref. An output of the comparator 124 may be coupled to the control circuit 128. The control circuit 128 may be further coupled to the potentiometer 126 to control the impedance of the potentiometer 126.

During a calibration process (performed when the circuit 100 is in the calibration mode), the comparator may compare the regulated voltage Vreg to the reference voltage Vref and pass the results of the comparison to the control circuit 128. The control circuit 128 may adjust the impedance of the potentiometer 126, based on the comparison by the comparator 124, to adjust the calibration voltage Vcal provided to the open-loop voltage regulator 104 until the regulated voltage Vreg received by the comparator 124 is approximately equal to the reference voltage Vref. Accordingly, the first portion of the calibration process may calibrate the regulated voltage Vreg to have the target value. Calibration of the regulated voltage Vreg to the target value may compensate for process variation in the open-loop voltage regulator 104 (e.g., in the transistors 116*a-b* of the open-loop voltage regulator 104). In some embodiments, the target value may cause the DCO 102 to be approximately in the middle of its tuning range.

After the regulated voltage, Vreg, has been calibrated to the target value, the DCO 102 may be tuned to generate the output signal with the desired frequency. The DCO 102 may first be coarsely tuned using the coarse tuning code, and then finely tuned using the fine tuning code. After completion of the calibration process, the circuit 110 may transition from the calibration mode to a normal operating mode.

In various embodiments, the calibration circuit 110 may enter a monitoring mode during normal operation of the DCO 102. During the monitoring mode, the control circuit 128 may monitor for drift in a tuning code (e.g., the fine tuning code) of the DCO 102. For example, the control circuit 128 may receive the fine tuning code (e.g., the tine tuning code) that is used to tune the output frequency generated by the DCO 102, The control circuit 128 may determine if the tuning code is outside a pre-determined range of tuning codes. The pre-determined range of tuning codes may be defined by an upper threshold and a lower threshold. The upper threshold may be less than a maximum possible value of the tuning code, and the lower threshold may be greater than a minimum possible value of the tuning code. Accordingly, the pre-determined range of tuning codes may include less than all possible values for the tuning code.

If the control circuit 128 determines that the tuning code is outside the pre-determined range of tuning codes (e.g., the tuning code is greater than the upper threshold or less than the lower threshold), then the control circuit 128 may adjust the value of the calibration voltage Vcal (e.g., by adjusting the impedance of the potentiometer 126) so that the tuning code is inside the pre-determined range of tuning codes (e.g., after the tuning circuit 115 adjusts the tuning code to compensate for the change in the value of the regulated supply voltage Vreg caused by the change in the calibration voltage Vcal). For example, the control circuit 128 may adjust the value of the calibration voltage Vcal so that the tuning code is substantially in the middle of the pre-determined range of tuning codes.

Accordingly, the monitoring of the tuning code by the control circuit 128 may compensate for drift in the DCO 102 (e.g., due to temperature changes, aging, or other factors).

Figure 3:
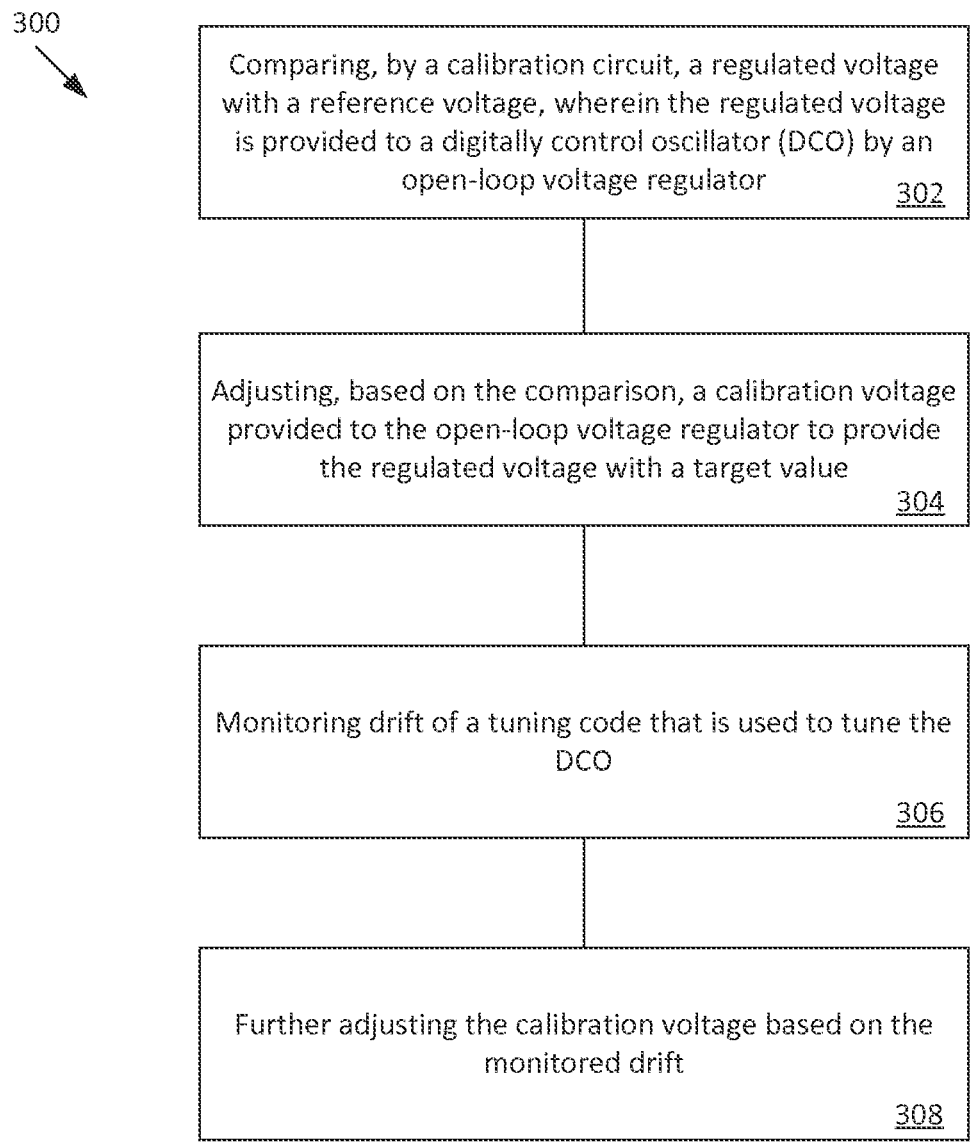
FIG. 3 illustrates an example method in accordance with various embodiments.

FIG. 3 illustrates a method 300 in accordance with various embodiments. The method 300 may be performed by a calibration circuit (e.g., calibration circuit 110) that is coupled to an open-loop voltage regulator (e.g., open-loop voltage regulator 104) and a DCO (e.g., DCO 102). In some embodiments, the calibration circuit may include one or more non-transitory computer-readable media having instructions, stored thereon, that when executed case the calibration circuit to perform the method 300.

At block 302, the method 300 may include comparing, by the calibration circuit, a regulated voltage provided to the DCO with a reference voltage, wherein the regulated voltage is provided to the DCO by an open-loop voltage regulator.

At block 304, the method 300 may include adjusting, based on the comparison, a calibration voltage provided to the open-loop voltage regulator to provide the regulated voltage with a target value.

At block 306, the method 300 may include monitoring drift of a tuning code that is used to tune the DCO. For example, the DCO may receive a coarse tuning code and a fine tuning code, and block 306 may include monitoring the fine tuning code.

At block 308, the method 300 may include further adjusting the calibration voltage based on the monitored drift.

In some embodiments, the monitoring the drift at block 306 of the method 300 may include receiving the tuning code and determining if the tuning code is outside a pre-determined range of tuning codes. Additionally, the further adjusting the calibration voltage at block 308 may include, if the tuning code is outside the pre-determined range of tuning codes, adjusting the calibration voltage so that the tuning code is inside the pre-determined range of tuning codes.

FIG. 4 illustrates an example computing device 400 that may employ the apparatuses and/or methods described herein (e.g., circuit 100, DCO 200, method 300), in accordance with various embodiments. As shown, computing device 400 may include a number of components, such as one or more processor(s) 404 (one shown) and at least one communication chip 406. In various embodiments, the one or more processor(s) 404 each may include one or more processor cores. In various embodiments, the at least one communication chip 406 may be physically and electrically coupled to the one or more processor(s) 404. In further implementations, the communication chip 406 may be part of the one or more processor(s) 40.4. In various embodiments, computing device 400 may include printed circuit board (PCB) 402. For these embodiments, the one or more processor(s) 404 and communication chip 406 may be disposed thereon. In alternate embodiments, the various components may be coupled without the employment of PCB 402.

Depending on its applications, computing device 400 may include other components that may or may not be physically and electrically coupled to the PCB 402. These other components include, but are not limited to, memory controller 405, volatile memory (e.g., dynamic random access memory (DRAM) 408), non-volatile memory such as read only memory (ROM) 410, flash memory 412, storage device 411 (e.g., a hard-disk drive (HDD)), an controller 414, a digital signal processor (not shown), a crypto processor (not shown), a graphics processor 416, one or more antenna 418, a display (not shown), a touch screen display 420, a touch screen controller 422, a battery 424, an audio codec (not shown), a video codec not shown), a global positioning system (GPS) device 428, a compass 430, an accelerometer (not shown), a gyroscope (not shown), a speaker 432, a camera 434, and amass storage device (such as hard disk drive, a solid state drive, compact disk (CD), digital versatile disk (DVD)) (not shown), and so forth. In various embodiments, the processor 404 may be integrated on the same die with other components to form a System on Chip (SoC).

In some embodiments, the one or more processor(s) 404, flash memory 412, and/or storage device 411 may include associated firmware (not shown) storing programming instructions configured to enable computing device 400, in response to execution of the programming instructions by one or more processor(s) 404, to practice all or selected aspects of the methods described herein (e.g., method 300). In various embodiments, these aspects may additionally or alternatively be implemented using hardware separate from the one or more processor(s) 404, flash memory 412, or storage device 411.

In various embodiments, one or more components of the computing device 400 may include the circuit 100 and/or DCO 200 described herein. For example, the circuit 100 and/or DCO 200 may be included in I/O controller 414, processor 404, memory controller 405, and/or another component of computing device 400. In some embodiments, the circuit 100 and/or DCO 200 may be used in a High-Speed Serial Link application (e.g., to generate a clock signal and/or other oscillating signal).

The communication chips 406 may enable wired and/or wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth, and a second communication chip 406 may be dedicated to longer range wireless communications such as GPS, EDGE, GPRS, CDMA, WiMAX, LTE, Ev-DO, and others.

In various implementations, the computing device 400 may be a laptop, a netbook, a notebook, an ultrabook, a smartphone, a computing tablet, a personal digital assistant (PDA), an ultra-mobile PC, a mobile phone, a desktop computer, a server, a printer, a. scanner, a monitor, a set-top box, an entertainment control unit (e.g., a gaming console or automotive entertainment unit), a digital camera, an appliance, a portable music player, or a digital video recorder. In further implementations, the computing device 400 may be any other electronic device that processes data.

Some non-limiting Examples are provided below.

Example 1 is a voltage regulation circuit comprising: a supply rail to receive a supply voltage; an open-loop voltage regulator coupled to the supply rail and including a transistor, the open-loop voltage regulator to provide a regulated voltage to a digital-controlled oscillator (DCO); and a calibration circuit coupled to the open-loop voltage regulator, the calibration circuit to, during a calibration mode of the circuit, adjust a calibration voltage provided to the open-loop voltage regulator to provide the regulated voltage with a target value.

Example 2 is the circuit of Example 1, further comprising the DCO coupled to the open-loop voltage regulator.

Example 3 is the circuit of Example 1, wherein the calibration circuit includes: a potentiometer coupled to the open-loop voltage regulator; a comparator to compare the regulated voltage to a reference voltage; and a control circuit coupled to the potentiometer and the comparator, the control circuit to adjust an impedance of the potentiometer, based on the comparison by the comparator, to adjust the calibration voltage provided to the open-loop voltage regulator.

Example 4 is the circuit of Example 1, wherein a drain terminal of the transistor is coupled to the DCO to provide the regulated voltage, wherein the open-loop voltage regulator further includes a low-pass resistance-capacitance (RC) filter coupled to a gate terminal of the transistor.

Example 5 is the circuit of Example 4, wherein the transistor, the resistor, and the capacitor are included in a first stage of the open-loop voltage regulator, and wherein the open-loop voltage regulator further includes a second stage that has a transistor coupled between the transistor of the first stage and the supply rail.

Example 6 is the circuit of any one of Examples 1 to 5, wherein the calibration circuit is further to: receive a digital tuning code that is used to tune an output frequency of the DCO; determine if the tuning code is outside a pre-determined range of tuning codes; and if the tuning code is outside the pre-determined range of tuning codes, adjust the calibration voltage so that the tuning code is inside the pre-determined range of tuning codes.

Example 7 is the circuit of Example 6, wherein the calibration circuit is to determine if the tuning code is outside the pre-determined range of tuning codes and to adjust the calibration voltage so that the tuning code is inside the pre-determined range of tuning codes during normal operation of the DCO and after adjusting the calibration voltage provided to the open-loop voltage regulator to provide the regulated voltage with the target value during the calibration mode of the DCO.

Example 8 is the circuit of Example 6, wherein the tuning code is a fine tuning code.

Example 9 is the circuit of Example 6, wherein the pre-determined range of tuning codes includes less than all possible values for the tuning code.

Example 10 is a method for providing a regulated voltage to a digitally controlled oscillator (DCO), the method comprising: comparing, by a calibration circuit, a regulated voltage with a reference voltage, wherein the regulated voltage is provided to a DCO by an open-loop voltage regulator; adjusting, based on the comparison, a calibration voltage provided to the open-loop voltage regulator to provide the regulated voltage with a target value; monitoring drift of a tuning code that is used to tune the DCO; and further adjusting the calibration voltage based on the monitored drift.

Example 11 is the method of Example 10, wherein the monitoring the drift includes: receiving the tuning code; and determining if the tuning code is outside a pre-determined range of tuning codes; and wherein the further adjusting the calibration voltage based on the monitored drift includes, if the tuning code is outside the pre-determined range of tuning codes, adjusting the calibration voltage so that the tuning code is inside the pre-determined range of tuning codes.

Example 12 is the method of Example 10, wherein the adjusting the calibration voltage is performed by controlling an impedance of a digital potentiometer coupled to the open-loop voltage regulator.

Example 13 is the method of Example 10, wherein the comparing the regulated voltage with the reference voltage and the adjusting, based on the comparison, the calibration voltage are performed during a calibration mode of the DCO, and wherein the monitoring the drift of the tuning code and the further adjusting the calibration voltage based on the monitored drift are performed during a normal operating mode of the DCO after the calibration mode.

Example 14 is the method of any one of Examples 10 to 13, wherein the tuning code is a fine tuning code, and wherein the DCO is further to receive a coarse tuning code.

Example 15 is a computing system comprising: a display; a processor coupled to the display; and a communication circuit coupled to the processor. The communication circuit includes: a digitally controlled oscillator (DCO); an open-loop voltage regulator to receive a calibration voltage and to provide a regulated voltage to the DCO based on the calibration voltage; and a calibration circuit coupled to the open-loop voltage regulator, the calibration circuit to: during a calibration mode, compare the regulated voltage to a reference voltage and adjust the calibration voltage based on the comparison; and during a monitoring mode, receive a tuning code that is used to tune the DCO and further adjust the calibration voltage based on a value of the tuning code.

Example 16 is the system of Example 15, wherein the calibration circuit includes: a potentiometer coupled to the open-loop voltage regulator; a comparator to compare the regulated voltage to a reference voltage; and a control circuit coupled to the potentiometer and the comparator, the control circuit to adjust an impedance of the potentiometer, based on the comparison by the comparator, to adjust the calibration voltage provided to the open-loop voltage regulator.

Example 17 is the system of Example 15, wherein a drain terminal of the transistor is coupled to the DCO to provide the regulated voltage, wherein the open-loop voltage regulator further includes a low-pass filter coupled to a gate terminal of the transistor.

Example 18 is the system of Example 17, wherein the transistor, the resistor, and the capacitor are included in a first stage of the open-loop voltage regulator, and wherein the open-loop voltage regulator further includes a second stage that has a transistor coupled between the transistor of the first stage and a supply rail.

Example 19 is the system of Example 15, wherein, to further adjust the calibration voltage based on the value of the tuning code, the calibration circuit is to: determine if the value of the tuning code is outside a pre-determined range of values; and if the value of the tuning code is outside the pre-determined range of values, adjust the calibration voltage so that the value of the tuning code is inside the pre-determined range of tuning codes.

Example 20 is the system of any one of Examples 15 to 19, wherein the calibration circuit is to enter the calibration mode upon power up of the DCO, and wherein the calibration circuit is to be in the monitoring mode during normal operation of the DCO.

Example 21 is the system of Example 15, wherein the tuning code is a fine tuning code, and wherein the DCO is to receive the fine tuning code and a coarse tuning code.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit comprising:
   a supply rail to receive a supply voltage;
   an open-loop voltage regulator coupled to the supply rail and including a transistor, the open-loop voltage regulator to provide a regulated voltage to a digital-controlled oscillator (DCO);
   a calibration circuit coupled to the open-loop voltage regulator, the calibration circuit to, during a calibration mode of the circuit, adjust a calibration voltage provided to the open-loop voltage regulator to provide the regulated voltage with a target value;
   wherein the calibration circuit is further to:
      receive a digital tuning code that is used to tune an output frequency of the DCO;
      determine if the tuning code is outside a pre-determined range of tuning codes; and
      if the tuning code is outside the pre-determined range of tuning codes, adjust the calibration voltage so that the tuning code is inside the pre-determined range of tuning codes.

2. The circuit of claim 1, further comprising the DCO coupled to the open-loop voltage regulator.

3. The circuit of claim 1, wherein the calibration circuit includes:
   a potentiometer coupled to the open-loop voltage regulator;
   a comparator to compare the regulated voltage to a reference voltage; and
   a control circuit coupled to the potentiometer and the comparator, the control circuit to adjust an impedance of the potentiometer, based on the comparison by the comparator, to adjust the calibration voltage provided to the open-loop voltage regulator.

4. The circuit of claim 1, wherein a drain terminal of the transistor is coupled to the DCO to provide the regulated voltage, wherein the open-loop voltage regulator further includes a low-pass resistance-capacitance (RC) filter coupled to a gate terminal of the transistor.

5. The circuit of claim 4, wherein the low-pass RC filter includes a resistor and a capacitor, wherein the transistor, the resistor, and the capacitor are included in a first stage of the open-loop voltage regulator, and wherein the open-loop voltage regulator further includes a second stage that has a transistor coupled between the transistor of the first stage and the supply rail.

6. The circuit of claim 1, wherein the calibration circuit is to determine if the tuning code is outside the pre-determined range of tuning codes and to adjust the calibration voltage so that the tuning code is inside the pre-determined range of tuning codes during normal operation of the DCO and after adjusting the calibration voltage provided to the open-loop voltage regulator to provide the regulated voltage with the target value during the calibration mode of the DCO.

7. The circuit of claim 1, wherein the tuning code is a fine tuning code.

8. The circuit of claim 1, wherein the pre-determined range of tuning codes includes less than all possible values for the tuning code.

9. A method comprising:
  comparing, by a calibration circuit, a regulated voltage with a reference voltage, wherein the regulated voltage is provided to a digitally controlled oscillator (DCO) by an open-loop voltage regulator;
  adjusting, based on the comparison, a calibration voltage provided to the open-loop voltage regulator to provide the regulated voltage with a target value;
  receiving a digital tuning code that is used to tune an output frequency of the DCO;
  determining if the tuning code is outside a pre-determined range of tuning codes; and
  if the tuning code is outside the pre-determined range of tuning codes, adjusting the calibration voltage so that the tuning code is inside the pre-determined range of tuning codes.

10. The method of claim 9, wherein the adjusting the calibration voltage is performed by controlling an impedance of a digital potentiometer coupled to the open-loop voltage regulator.

11. The method of claim 9, wherein the comparing the regulated voltage with the reference voltage and the adjusting, based on the comparison, the calibration voltage are performed during a calibration mode of the DCO, and wherein the determining if the tuning code is outside the pre-determined range of tuning codes and adjusting the calibration voltage so that the tuning code is inside the pre-determined range of tuning codes are performed during a normal operating mode of the DCO after the calibration mode.

12. The method of claim 9, wherein the tuning code is a fine tuning code, and wherein the DCO is further to receive a coarse tuning code.

13. A system comprising:
  a display;
  a processor coupled to the display; and
  a communication circuit coupled to the processor, the communication circuit including:
    a digitally controlled oscillator (DCO);
    an open-loop voltage regulator to receive a calibration voltage and to provide a regulated voltage to the DCO based on the calibration voltage; and
    a calibration circuit coupled to the open-loop voltage regulator, the calibration circuit to:
      during a calibration mode, compare the regulated voltage to a reference voltage and adjust the calibration voltage based on the comparison to provide the regulated voltage with a pre-determined target voltage value; and
      during a monitoring mode, receive a tuning code that is used to tune the DCO and further adjust the calibration voltage based on a value of the tuning code, wherein, to further adjust the calibration voltage based on the value of the tuning code, the calibration circuit is to:
        determine if the value of the tuning code is outside a pre-determined range of values; and
        if the value of the tuning code is outside the pre-determined range of values, adjust the calibration voltage so that the value of the tuning code is inside the pre-determined range of tuning codes.

14. The system of claim 13, wherein the calibration circuit includes:
  a potentiometer coupled to the open-loop voltage regulator;
  a comparator to compare the regulated voltage to a reference voltage; and
  a control circuit coupled to the potentiometer and the comparator, the control circuit to adjust an impedance of the potentiometer, based on the comparison by the comparator, to adjust the calibration voltage provided to the open-loop voltage regulator.

15. The system of claim 13, wherein the open-loop voltage regulator includes a transistor, wherein a drain terminal of a transistor is coupled to the DCO to provide the regulated voltage, wherein the open-loop voltage regulator further includes a low-pass filter coupled to a gate terminal of the transistor.

16. The system of claim 15, wherein the transistor and the low-pass filter are included in a first stage of the open-loop voltage regulator, and wherein the open-loop voltage regulator further includes a second stage that has a transistor coupled between the transistor of the first stage and a supply rail.

17. The system of claim 13, wherein the calibration circuit is to enter the calibration mode upon power up of the DCO, and wherein the calibration circuit is to be in the monitoring mode during normal operation of the DCO.

18. The system of claim 13, wherein the tuning code is a fine tuning code, and wherein the DCO is to receive the fine tuning code and a coarse tuning code.

* * * * *